United States Patent [19]
Wyatt

[11] Patent Number: 5,216,386
[45] Date of Patent: Jun. 1, 1993

[54] TRANSIMPEDANCE AMPLIFIER

[75] Inventor: Michael A. Wyatt, Clearwater, Fla.

[73] Assignee: Honeywell Inc., Minneapolis, Minn.

[21] Appl. No.: 810,822

[22] Filed: Dec. 20, 1991

[51] Int. Cl.$^5$ ............................................. H03F 3/08
[52] U.S. Cl. ..................................... 330/308; 330/300
[58] Field of Search ............. 250/214 A; 330/59, 290, 330/296, 300, 308, 311

[56] References Cited

U.S. PATENT DOCUMENTS

| | | | |
|---|---|---|---|
| 4,620,321 | 10/1986 | Chown | 330/308 X |
| 4,882,482 | 11/1989 | Smith et al. | 330/308 X |

*Primary Examiner*—Steven Mottola
*Attorney, Agent, or Firm*—Donald J. Lenkszus

[57] ABSTRACT

An improved transimpedance amplifier having a wide bandwidth, stable operation and high gain including a cascode input transistor stage. The cascode input stage includes a JFET transistor coupled to a photodiode output providing the current input for the transimpedance amplifier. The output of the JFET transistor is coupled to the emitter of a bipolar transistor having its base grounded. The JFET reduces current noise in the transimpedance amplifier and the bipolar transistor provides the required high gain while coupling the Miller capacitance to ground. The output of the bipolar transistor is coupled through the base of a second bipolar transistor which provides a buffer for the transimpedance amplifier. An output level shift provides the feedback voltage to the cascode input stage.

7 Claims, 1 Drawing Sheet

TRANSIMPEDANCE AMPLIFIER

FIELD OF THE INVENTION

The present invention relates generally to transimpedance amplifiers, and more particularly to an improved high gain transimpedance amplifier having a wide bandwidth.

BACKGROUND OF THE INVENTION

Transimpedance amplifiers are utilized to convert current to voltage. In a typical transimpedance amplifier the current output by a photodiode is coupled to a transistor input stage. The transistor is generally either a bipolar or a junction FET type transistor. The transistor includes the so-called Miller capacitance (Cm) which effectively is coupled between the gate and drain of the FET type transistor. Cm is multiplied by 1 plus the voltage gain of the input stage of the transimpedance amplifier. Therefor, if a high gain transimpedance amplifier is desired, the bandwidth is severely limited by the Cm.

It therefore would be desirable to provide a transimpedance amplifier with a high gain, while maintaining a wide bandwidth and stable operation.

SUMMARY OF THE INVENTION

The present invention is directed to an improved transimpedance amplifier having a wide bandwidth, stable operation and high gain. The input transistor stage of the improved transimpedance amplifier is formed by a cascode input stage. The cascode input stage includes a JFET transistor coupled to a photodiode output providing the current input for the transimpedance amplifier. The output of the JFE transistor is coupled to the emitter of a bipolar transistor having its base grounded. The JFET reduces current noise in the transimpedance amplifier and the bipolar transistor provides the required high gain while coupling the Cm to ground. The output of the bipolar transistor is coupled through the base of a second bipolar transistor which provides a buffer for the transimpedance amplifier.

These and other features and advantages of the invention will be more readily apparent upon reading the following description of a preferred exemplified embodiment of the invention and upon reference to the accompanying drawings wherein:

Figure 1:
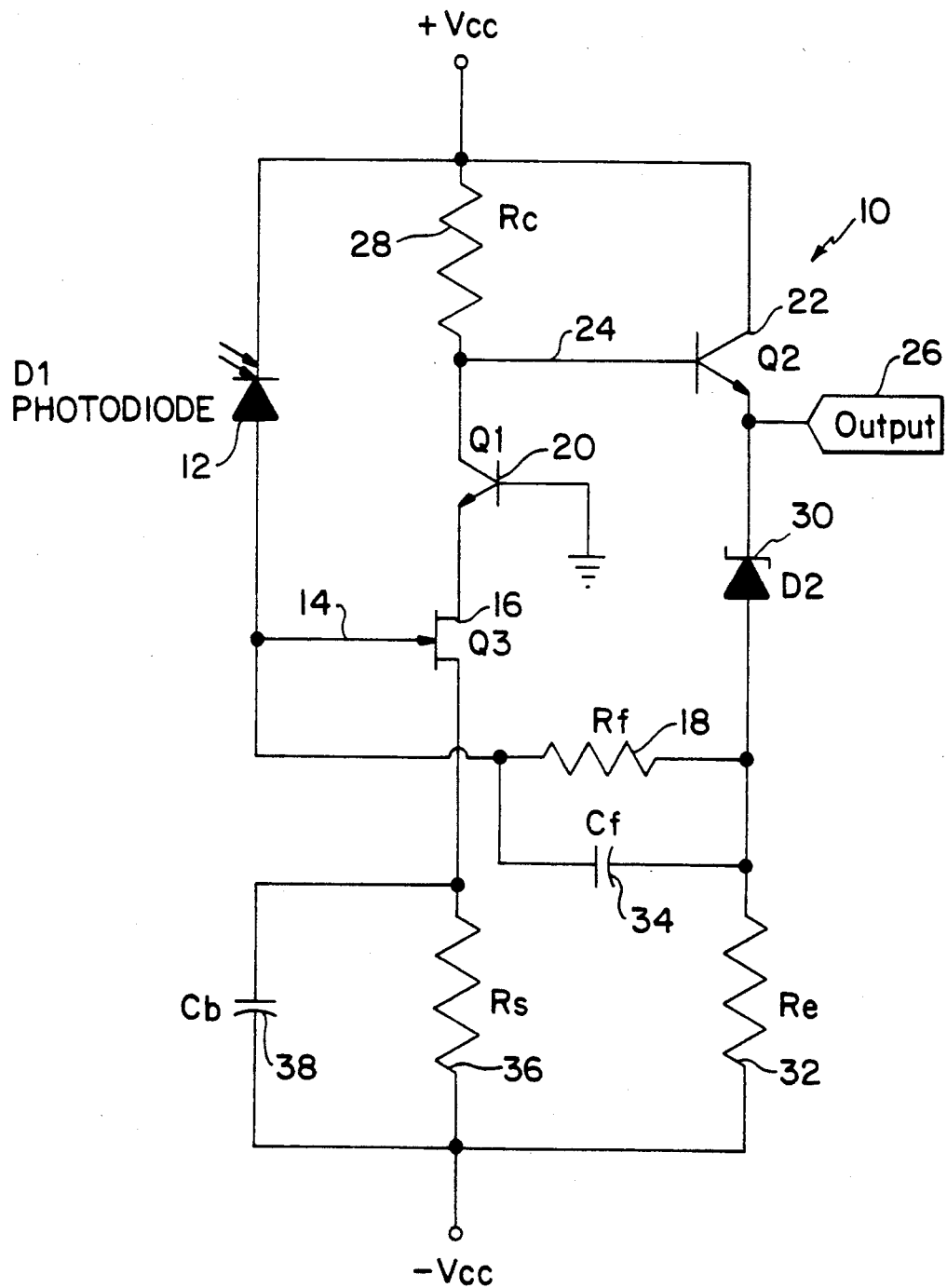
FIG. 1 is a schematic diagram of one embodiment of the transimpedance amplifier of the present invention.

While the invention will be described and disclosed in connection with certain preferred embodiments and procedures, it is not intended to limit the invention to those specific embodiments. Rather it is intended to cover all such alternative embodiments and modifications as fall within the spirit and scope of the invention.

DESCRIPTION OF THE PREFERRED EMBODIMENT

Referring to FIG. 1, one embodiment of an improved transimpedance amplifier of the present invention is designated generally by the reference numeral 10. The transimpedance amplifier 10 includes a photodiode 12, which when exposed to light provides an output current related to the light intensity coupled on a line 14 to a JFET transistor 16.

The JFET transistor 16 minimizes current noise in the transimpedance amplifier 10. Current noise is the dominate noise source in a high gain transimpedance amplifier. The current noise is forced through a feedback resistor 18 and converted into output voltage noise.

The output of the JFET transistor 16 is coupled to the emitter of a bipolar transistor 20. The output of the bipolar transistor 20 is coupled from the emitter to the collector. The collector of the bipolar transistor 20 is coupled to the base of a second bipolar transistor 22 via a line 24. The bipolar transistor 22 is an emitter follower which provides a low output impedance to an output line 26 of the transimpedance amplifier 10.

The problem solved by the hybrid cascode input stage formed by the JFET 16 and the bipolar transistor 20 is the effective elimination of the Cm. As previously stated, the Cm is effectively coupled from the input of the JFET 16 to the output. In operation, Cm is multiplied by 1 plus the voltage gain of the stage. Therefor, if the JFET 16 has a high gain then the bandwidth of the transimpedance amplifier 10 is severely limited.

This is avoided by limiting the voltage gain of the JFET 16 to a low value. This essentially eliminates Cm from the JFET 16 part of the input stage. The emitter of the bipolar transistor 20 provides a low impedance input to the JFET 16. The bipolar transistor 20 is selected to have a high gain, but the bipolar transistor 20 still has the above-referenced Cm problem. In the bipolar transistor 20, the Cm is coupled from the collector to the base, which is grounded. Therefor, the Cm of the bipolar transistor 20 effectively is shunted to ground.

The power supply voltage Vcc is coupled to the bipolar transistor 20 via a resistor 28. The high input, low output impedance bipolar transistor 22 prevents loading on the resistor 28. A zener diode 30 is coupled from the output 26 via a resistor 32 to the negative supply voltage −Vcc. The zener diode 30 provides DC level shifting which could also be accomplished with an AC bypassed resistor. The resistor 32 controls the emitter current of the bipolar transistor 22.

The DC current feedback resistor 18 is coupled in parallel with a capacitor 34, which together are selected to control the closed loop bandwidth of the transimpedance amplifier 10. The values of the power supply voltage Vcc, Vee, the bandwidth and the gain of the transimpedance amplifier 10 are interrelated and selected for a particular operation. The capacitor 34 and the resistor 18 provide a DC and AC feedback path to essentially bias the transimpedance amplifier 10 to the operating point. The transimpedance amplifier 10 thus is relatively insensitive to fluctuations in Vcc and Vcc, and in one embodiment has operated from + or −8 to + or −15 volts DC.

The nominal bias of the transimpedance amplifier 10 is set by a resistor 36 coupled between −Vcc and the JFET 16. A capacitor 38 provides a bypass at the frequency of operation of the transimpedance amplifier 10. This provides maximum gain for the transimpedance amplifier 10.

The key to the wide bandwidth and stability of the transimpedance amplifier 10 is the transient time around the closed loop. The loop time delay or transient time of the transimpedance amplifier 10 is maintained at a minimum by the minimum number of active devices in the feedback loop, i.e., the JFET 16, the bipolar transistor 20, the bipolar transistor 22 and the zener diode 30. The minimum number of active devices also extends the bandwidth and enhances the stability of the transimpedance amplifier 10. The input of the JFET 16 is effectively a summing node, which provides the stability. If another amplifier stage was added, the transient time would increase, which would effect both the bandwidth and the stability of the transimpedance amplifier 10.

In designing the transimpedance amplifier 10, a bipolar transistor input stage was rejected because although the bandwidth would be extended, the current noise is very high. If a silicon JFET was selected, then the current noise could be minimized, but the bandwidth then was decreased. The JFET does have an increase in voltage noise, but the current noise dominates in the high gain transimpedance amplifier 10. The grounded base bipolar transistor 20 then was added to the input stage to provide the desired gain for the transimpedance amplifier 10.

The zener diode 30 is utilized as a level shift to provide a DC feedback voltage of less than or equal to the source voltage Vcc. If desired the level shift could be provided by a resistor or a series of diodes.

The embodiments of an invention in which an exclusive property or right is claimed are defined as follows:

1. An improved transimpedance amplifier, comprising:
   photodiode means adapted to provide a current output when exposed to a source of light;
   a JFET and a bipolar transistor forming a cascode input stage for the transimpedance amplifier, said JFET transistor coupled to the output of said photodiode means and having an output coupled to said bipolar transistor emitter, said bipolar transistor having a grounded base and having an output on the collector thereof;
   buffer means coupled to said bipolar transistor output to provide a voltage output for the transimpedance amplifier including an emitter follower bipolar transistor;
   DC level shifting means coupled to said buffer means for providing a feedback voltage to said cascode input stage including a zener diode; and
   including means coupled to said level shifting means for biasing said transimpedance amplifier around a selected operating point, wherein said transimpedance amplifier transient time is defined by said JFET, said bipolar transistor and said zener diode which extends the bandwidth and enhances the stability of the transimpedance amplifier.

2. The transimpedance amplifier as defined in claim 1 including means coupled to said level shifting means for biasing said transimpedance amplifier around a selected operating point.

3. The transimpedance amplifier as defined in claim 1 wherein said biasing means include a capacitor and a resistor coupled in parallel to provide an AC and a DC feedback path.

4. The transimpedance amplifier as defined in claim 1 wherein said biasing means include a capacitor and a resistor coupled in parallel to provide an AC and a DC feedback path.

5. An improved transimpedance amplifier, comprising:
   photodiode means adapted to provide a current output when exposed to a source of light;
   a JFET transistor coupled to the output of said photodiode means, said JFET having an output;
   a bipolar transistor having its emitter coupled to said JFET output, said bipolar transistor having a grounded base and having an output on the collector thereof, said JFET and said bipolar transistor forming cascode input stage means for said transimpedance amplifier;
   buffer means coupled to said bipolar transistor output to provide a voltage output for the transimpedance amplifier; and
   DC level shifting means coupled to said buffer means for providing a feedback voltage to said cascode input stage means coupled to said level shifting means for biasing said transimpedance amplifier around a selected operating point including a capacitor and a resistor coupled in parallel to provide an AC and a DC feedback path, wherein said transimpedance amplifier transient time is defined by said JFET, said bipolar transistor and said zener diode which extends the bandwidth and enhances the stability of the transimpedance amplifier.

6. The transimpedance amplifier as defined in claim 5 wherein said level shifting means include a zener diode.

7. The transimpedance amplifier as defined in claim 5 wherein said buffer means include an emitter follower bipolar transistor.

* * * * *

UNITED STATES PATENT AND TRADEMARK OFFICE
CERTIFICATE OF CORRECTION

PATENT NO. : 5,216,386
DATED : 1 June 1993
INVENTOR(S) : MICHAEL A. WYATT

It is certified that error appears in the above-indentified patent and that said Letters Patent is hereby corrected as shown below:

Column 1, Line 1 should read as follows:

The Government has rights in this invention pursuant to Contract No. N66001-90-Z-0162, awarded by the Department of the Navy.

Signed and Sealed this

Fourteenth Day of June, 1994

Attest:

BRUCE LEHMAN

*Attesting Officer*     *Commissioner of Patents and Trademarks*